United States Patent [19]

Markarian

[11] 3,795,844

[45] Mar. 5, 1974

[54] ELECTRONIC COMPONENT PACKAGE

[75] Inventor: Mark Markarian, Williamstown, Mass.

[73] Assignee: Sprague Electric Company, North Adams, Mass.

[22] Filed: Feb. 26, 1973

[21] Appl. No.: 335,989

[52] U.S. Cl. .............................. 317/230, 174/50.61

[51] Int. Cl. .............................................. H01g 9/10

[58] Field of Search .... 317/230; 337/251, 186, 248; 174/50.61, 50.62

[56] References Cited

UNITED STATES PATENTS

| | | | |
|---|---|---|---|
| 3,341,752 | 9/1967 | Fournier | 317/230 |
| 3,036,249 | 5/1962 | Hall | 317/230 |
| 3,123,696 | 3/1964 | McAlister | 337/251 |
| 2,532,078 | 11/1950 | Baxter | 331/251 X |
| 3,296,505 | 1/1967 | Sparrow et al. | 317/230 |
| 3,491,269 | 1/1970 | Booe | 317/230 |
| 3,611,054 | 10/1971 | Piper | 317/230 |
| 3,206,658 | 9/1965 | Markarian | 317/230 |
| 3,385,618 | 5/1968 | Hargis | 174/50.61 |
| 3,404,215 | 10/1968 | Burks et al. | 317/234 |

*Primary Examiner*—Rudolph V. Rolinec
*Assistant Examiner*—William D. Larkins

[57] ABSTRACT

An electronic component package is disclosed comprising a metal tube upon whose surfaces is grown an oxide insulative film. A metal layer covers each end of the tube including a portion of the tube's inside and outside surfaces. A component such as a solid tantalum capacitor, mounted inside the tube is contacted by a conductive plug in each end of the tube. The conductive layers, form the terminals of the package by which the component may be electrically and physically mounted by soldering to a hybrid integrated circuit substrate.

6 Claims, 1 Drawing Figure

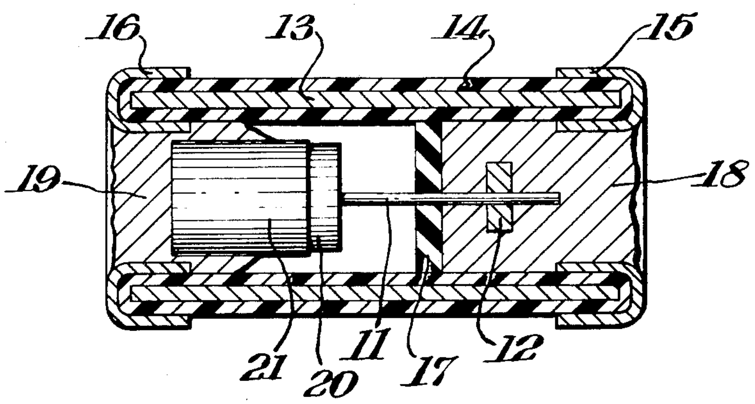
16
13
14
15
19
18
21
20
11
17
12

ELECTRONIC COMPONENT PACKAGE

BACKGROUND OF THE INVENTION

This invention is related to electronic components designed for flush mounting in hybrid integrated circuits. Requirements for such components usually include small size and high volume efficiency, a disciplined geometry for ease in hybrid circuits assembly, and the ability to withstand the soldering temperatures employed when mounting to the hybrid circuit substrate. Soldering conditions may be as severe as 360°C for as long as 3 minutes.

A well known example of such a component is the so-called monolythic ceramic chip capacitor. It consists of alternate layers of conductive material and ceramic, having been fired at a very high temperature. It is usually a right parallelepiped having terminals comprised of a conductive layer at each end. The conductive layer terminals may contain silver and may be at least partly comprised of a solder coating such that the chip may be reflow soldered flush to a hybrid circuit substrate.

Also, similar component packages are known that are designed for snapping into fuse clips such as that taught by Fournier in U.S. Patent No. 3,341,752.

Most component bodies such as solid tantalum capacitors, that are inherently capable of withstanding the soldering temperatures, are not readily solderable, do not possess a disciplined or appropriate geometry, and require a protective covering against moisture, physical abuse, and chemical corrosion.

It is therefore an object of the present invention to provide a low cost, component package, having a high volume efficiency, that is suitable for soldering to a hybrid integrated circuit.

It is a further object of this invention to provide a component package with a uniform geometry and capable of withstanding high soldering temperatures.

SUMMARY OF THE INVENTION

An electronic component package employs an insulated tube, preferably rectangular, wherein a two terminal electronic component is mounted. Two conductive layers, each covering an end and a portion of the inner and outer surfaces of the tube, serve as the two externally accessible contacts of the package. Two conductive plugs, each in one end of the tube, connect the component terminals to the package contacts. The package is thus capable of being reflow solder connected, flush to a hybrid integrated circuit substrate.

BRIEF DESCRIPTION OF THE DRAWING

The FIGURE shows a preferred embodiment of the electronic component package of this invention. It is shown in sectional view except the basic component enclosed in the package is shown in elevated view.

DESCRIPTION OF THE PREFERRED EMBODIMENT

A preferred embodiment of this invention is shown in cross section in the figure, not necessarily to scale. A solid tantalum capacitor body 10 is shown having the usual tantalum wire 11, that serves as one of the capacitor terminals, protruding from one end. A metal strip 12 is shown welded to the tantalum wire 11. A major portion of the surface of the body 20 is covered with a metal coating 21, thus forming the other capacitor terminal. This coating 21 may be copper applied by metal flame spraying, and masked from the right end of the body surface, as shown in the figure.

The body 20, with wire 11 and strip 12 is all mounted inside a nickel tube 13. The tube 13 has a square shape (not seen in this view). An oxide film 14 having been grown by thermal oxidation over the entire surface of the tube 13, forms an insulative barrier inside and outside the tube. At the vicinity of each end of the tube 13, conductive silver layers, 15 and 16, adhere to the oxide film 14. These layers extend over a portion of the inside and outside surfaces of the rectangular tube, and they serve as the externally accessible contacts 15 and 16 of the component package.

An insulative washer 17, having a centered hole through which wire 11 passes, helps to center the capacitor inside the tube. A plug 18, formed of a relatively high temperature melting solder, such as 5 percent pin and 95 percent lead, fills an end of tube 13 making contact with the wire 11 and strip 12 as well as the conductive silver layer 15. Similarly a second conductive plug 19 fills the other end of the tube 13, making contact with the copper coating 21 or the capacitor body 20 as well as with the other silver layer 16.

It is now seen that the washer 17 may serve the additional function of damming the flow of the solder which forms plug 18. In practice it has been found unnecessary to dam the flow of solder that forms the plug 19, since the capacitor body almost completely fills the space in the tube as would be seen in end view.

The tube 13 in the preferred embodiment is rectangular, rather than cylindrical, so that the completed package can more readily be flush mount reflow soldered to a hybrid integrated circuit substrate. A rectangularly shaped body that fits snugly into the rectangular tube is preferred so as to achieve a high volt-capacity product per cubic volume of package. Likewise, the drawing is elongated to show clearly all the structural features of the embodiment, but in practice the welded strip 12 may be within 0.025 inches of the capacitor body 10 so that the length of the finished package may be no more than 0.050 inches longer than the body 10. Thus it is possible to achieve a volume efficiency well over 50 percent even for packages as small as $10^{-3}$ cubic inches.

In the practice of this invention other metals than nickel, that are capable of forming stable insulating films by thermal oxidation, may be employed for making the tube. Numerous nickel alloys will be suitable. Alternatively, tubes may be made from aluminum, tantalum, zirconium or other valve metals. In this case the oxide film can be formed by a normal anodizing process which is capable of covering the entire surface, inside and outside the tube.

The insulated tube may alternatively be a steatite or alumina ceramic. However, it may not be practical to make such a tube with wall thicknesses as small as 0.005 inches. Thus for packages of the small size described, the volume efficiency will not be as good as the nickel tube whose wall thickness may be as small as 0.001 inches. Other suitable tube materials are silicone resin impregnated woven glass, or glass and a high temperature polymer such as a polyimide resin, or the like.

Also instead of the fired silver layer contacts, other materials are suitable. For example a commercially produced silver loaded paste with an acrylic base may be used. It typically will require an air dry followed by an hour at about 150°C. The resulting layer is solderable and is capable of with standing temperatures as high as 300°C.

Numerous materials will be suitable for use as conducting plugs. For example the aforementioned solder consisting of 95 percent lead and 5 percent tin has a liquidus of 313°C. For filling the ends of tubes of the approximate dimensions previously described, the filling procedure of preheating the tube to about 200°C and submersing the tube ends into a 325°C pot of the 5/95 solder has been found effective. The solder fills the ends by capillary action. A component package having such plugs can be successfully soldered to a hybrid circuit substrate at temperatures between 200° and about 280°C, and for many applications this is adequate, e.g. when reflowing 60/40 tin lead solder between the package and the substrate. When it is desirable to withstand a higher temperature, the plugs may be formed with higher temperature melting metals such as lead or zinc. Further alternatives may consist of other metal powder loaded materials such as epoxy resin.

A major advantage of employing an all metal solder plug, is that in combination with a metal tube, it forms a true hermetically sealed package.

Prototype electronic component packages were built according to the principles of the present invention. They are like the above described preferred embodiment except for having conductive resin instead of solder plugs.

The square nickel tube, has the dimensions of 0.080 inches × 0.080 inches × 0.200 inches long and a wall thickness of approximately 0.005 inches. The tube was heated in a muffle furnace for 1 hour at 1,175°C, thus forming an oxide film over its entire surface inside and out. The ends of the tube were then submersed in a normal firing type silver paste containing glass frit, coating the oxidized tube ends for about 0.025 inches in the direction of the tube axis. The tube was subsequently placed in a kiln at 750°C for 10 minutes, firing the silver and forming a highly conductive, tightly adhering layer of silver to the oxide. The subassembly comprising a tantalum body, wire, washer, and welded nickel strip was then inserted into about the center of the tube.

A silicone resin binder filled with finely divided silver, ECCOBOND solder 59C, was dispersed into the ends of the tube with a hypodermic needle. (ECCOBOND is a trademark of Emerson and Cuming, Inc.). This material is viscous enough and the dimensions of the tube cavity is small enough that the resin does not run out. After an air drying at room temperature for several hours, most of the solvents have evaporated and the resin becomes stiff, such that upon subsequent curing it remains in place. Curing is accomplished by placing the part in an oven at 85°C for 1 hour, followed by 1 hour at 150°C.

The component packages were heated in a circulating air oven having a temperature of 360°C for 3 minutes. No physical damage to the package occurred. The resulting changes in electrical characteristics are shown in the following table:

Before Heating

| Sample Package | Cap. (μfd) | D.F. | $I_l$ (μa) | Z (ohms at 1000 Hz) |
|---|---|---|---|---|
| 1 | 1.03 | 0.9 | 3.0 | 0.70 |
| 2 | 1.07 | 0.9 | 3.6 | 0.61 |

After Heating

| Sample Package | Cap. (μfd) | D.F. | $I_l$ (μa) | Z (ohms at 1000 Hz) |
|---|---|---|---|---|
| 1 | 1.08 | 1.7 | 2.5 | 1.5 |
| 2 | 1.12 | 1.8 | 3.0 | 1.3 |

These changes on 360° heating are considered minimal and resulting capacitor values fall within limits for capacitors of this type.

It is obvious that a wide range of materials and combinations thereof may be employed in the practice of this invention. It is intended that the scope of this invention be limited only by the appended claims.

What is claimed is:

1. An electronic component package comprising a metal tube having an insulative coating over all surfaces thereof an electronic component, having two terminals, being mounted inside said tube; a first conductive layer extending over a portion of the inside and outside surfaces of said tube at one end of said tube; a second conductive layer extending over another portion of said inside and outside surfaces of said tube at the other end of said tube; two conductive plugs each filling one of said two ends and each said plug connecting between one of said component terminals and one of said conductive layers; the external regions of each said layer serving as the electrical contacts of said electronic component package.

2. The package of claim 1, wherein said tube is formed of nickel or an alloy thereof, having a thermally grown insulative oxide film over its surfaces.

3. The package of claim 1, wherein said tube is formed of one of the valve metals, having an anodized insulative oxide film over its surfaces.

4. The package of claim 1, wherein said conductive layers, have been made of a firing silver.

5. The package of claim 1 wherein said plugs are composed of a silver loaded silicone resin.

6. The package of claim 1 wherein said plugs are composed of a tin-lead alloy solder.

* * * * *